(12) United States Patent
Ji et al.

(10) Patent No.: US 11,797,202 B2
(45) Date of Patent: Oct. 24, 2023

(54) STORAGE DEVICE AND METHOD FOR FOGGY AND FINE PROGRAMMING

(71) Applicant: SK hynix Inc., Gyeonggi-do (KR)

(72) Inventors: Seung Gu Ji, Gyeonggi-do (KR); Jun Rye Rho, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 48 days.

(21) Appl. No.: 16/918,521

(22) Filed: Jul. 1, 2020

(65) Prior Publication Data

US 2021/0191636 A1 Jun. 24, 2021

(30) Foreign Application Priority Data

Dec. 24, 2019 (KR) .......................... 10-2019-0173802

(51) Int. Cl.
*G06F 3/06* (2006.01)

(52) U.S. Cl.
CPC .......... *G06F 3/0634* (2013.01); *G06F 3/0604* (2013.01); *G06F 3/0679* (2013.01)

(58) Field of Classification Search
CPC ..... G06F 3/0634; G06F 3/0604; G06F 3/0679
See application file for complete search history.

(56) References Cited

U.S. PATENT DOCUMENTS

| | | | | |
|---|---|---|---|---|
| 9,269,445 | B1 * | 2/2016 | Abe | G11C 16/10 |
| 2013/0094294 | A1 * | 4/2013 | Kwak | G11C 16/08 |
| | | | | 365/185.03 |
| 2015/0095558 | A1 * | 4/2015 | Kim | G11C 16/10 |
| | | | | 711/103 |
| 2015/0117114 | A1 * | 4/2015 | Wan | G11C 11/5642 |
| | | | | 365/185.21 |

(Continued)

FOREIGN PATENT DOCUMENTS

| KR | 10-2015-0047394 | 5/2015 |
|---|---|---|
| KR | 10-2018-0092422 | 8/2018 |

OTHER PUBLICATIONS

B. Zhou, J. Liu and Z. Liang, "A verification method for power-off protection mechanism of embedded chip non-volatile memory," 2021 IEEE International Conference on Power, Intelligent Computing and Systems (ICPICS), 2021, pp. 302-305, doi: 10.1109/ICPICS52425.2021.9524143.*

*Primary Examiner* — Andrew J Cheong
(74) *Attorney, Agent, or Firm* — IP & T GROUP LLP

(57) ABSTRACT

A storage device may include a memory device including a memory block coupled to physical word lines each including pages, and a memory controller configured to control the memory device such that, in response to a power off event occurring during a program operation on a selected page, fine program operations are performed on to-be completed pages, which precede the selected page, on which foggy program operations have been completed and on which the fine program operations have not yet been performed. The program operation may include a foggy program operation of programming memory cells included in the pages so that each memory cell has a threshold voltage corresponding to any one of intermediate states corresponding to states, and a fine program operation of programming the memory cells having the threshold voltages corresponding to the intermediate states so that each memory cell has a threshold voltage corresponding to any one state.

14 Claims, 17 Drawing Sheets

(56) References Cited

U.S. PATENT DOCUMENTS

| | | | |
|---|---|---|---|
| 2016/0211014 A1* | 7/2016 | Lee | G11C 11/5628 |
| 2017/0263326 A1* | 9/2017 | Kondo | G11C 16/10 |
| 2018/0032395 A1* | 2/2018 | Yang | H04L 67/1097 |
| 2018/0075902 A1* | 3/2018 | Shirakawa | G11C 16/0483 |
| 2019/0196743 A1* | 6/2019 | Hsieh | G06F 3/0619 |
| 2019/0235787 A1* | 8/2019 | Kanno | G06F 3/0679 |
| 2019/0311772 A1* | 10/2019 | Diep | G11C 16/08 |
| 2020/0089430 A1* | 3/2020 | Kanno | G06F 3/0679 |
| 2020/0194078 A1* | 6/2020 | Kondo | G11C 11/5628 |
| 2020/0233739 A1* | 7/2020 | Oh | G06F 11/0751 |
| 2020/0273530 A1* | 8/2020 | Shimura | G11C 16/08 |

\* cited by examiner

FIG. 10

PROGRAM SEQUENCE INFORMATION

| Physical WL | Logical WL | Page | Foggy PGM | Fine PGM |
|---|---|---|---|---|
| WL1 | LWL1 | PG1 | 1 | 9 |
| | LWL2 | PG2 | 2 | 10 |
| | LWL3 | PG3 | 3 | 11 |
| | LWL4 | PG4 | 4 | 12 |
| WL2 | LWL1 | PG5 | 5 | 17 |
| | LWL2 | PG6 | 6 | 18 |
| | LWL3 | PG7 | 7 | 19 |
| | LWL4 | PG8 | 8 | 20 |
| WL3 | LWL1 | PG9 | 13 | 25 |
| | LWL2 | PG10 | 14 | 26 |
| | LWL3 | PG11 | 15 | 27 |
| | LWL4 | PG12 | 16 | 28 |
| WL4 | LWL1 | PG13 | 21 | ⋮ |
| | LWL2 | PG14 | 22 | |
| | LWL3 | PG15 | 23 | |
| | LWL4 | PG16 | 24 | |

| Physical WL | Logical WL | Page | Foggy PGM | Fine PGM |
|---|---|---|---|---|
| WL1 | LWL1 | PG1 | 1 | 9 |
| | LWL2 | PG2 | 2 | 10 |
| | LWL3 | PG3 | 3 | 11 |
| | LWL4 | PG4 | 4 | 12 |
| WL2 | LWL1 | PG5 | 5 | 17 |
| | LWL2 | PG6 | 6 | 18 |
| | LWL3 | PG7 | 7 | 19 |
| | LWL4 | PG8 | 8 | 20 |
| WL3 | LWL1 | PG9 | 13 | 21 |
| | LWL2 | PG10 | 14 | 22 |
| | LWL3 | PG11 | 15 | 23 |
| | LWL4 | PG12 | 16 | 24 |
| WL4 | LWL1 | PG13 | DUMMY | DUMMY |
| | LWL2 | PG14 | DUMMY | DUMMY |
| | LWL3 | PG15 | DUMMY | DUMMY |
| | LWL4 | PG16 | DUMMY | DUMMY |
| WL5 | LWL1 | PG17 | New1 | |
| | LWL2 | PG18 | New2 | |
| | LWL3 | PG19 | New3 | |
| | LWL4 | PG20 | New4 | |

 POWER OFF OCCURRENCE

- PROGRAM-COMPLETED PAGE
- PAGE REQUIRED TO BE PROGRAM-COMPLETED AFTER POWER OFF REQUEST
- DUMMY: PAGE ON WHICH DUMMY PROGRAM MUST BE PERFORMED AFTER POWER OFF REQUEST

FIG. 12

PROGRAM SEQUENCE INFORMATION

| Physical WL | Logical WL | Page | Foggy PGM | Fine PGM |
|---|---|---|---|---|
| WL1 | LWL1 | PG1 | 1 | 6 |
| | LWL2 | PG2 | 2 | 8 |
| | LWL3 | PG3 | 3 | 10 |
| | LWL4 | PG4 | 4 | 12 |
| WL2 | LWL1 | PG5 | 5 | 14 |
| | LWL2 | PG6 | 7 | 16 |
| | LWL3 | PG7 | 9 | 18 |
| | LWL4 | PG8 | 11 | 20 |
| WL3 | LWL1 | PG9 | 13 | 22 |
| | LWL2 | PG10 | 15 | 24 |
| | LWL3 | PG11 | 17 | 26 |
| | LWL4 | PG12 | 19 | 28 |
| WL4 | LWL1 | PG13 | 21 | |
| | LWL2 | PG14 | 23 | ⋮ |
| | LWL3 | PG15 | 25 | |
| | LWL4 | PG16 | 27 | |

| Physical WL | Logical WL | Page | Foggy PGM | Fine PGM |
|---|---|---|---|---|
| WL1 | LWL1 | PG1 | 1 | 6 |
|  | LWL2 | PG2 | 2 | 8 |
|  | LWL3 | PG3 | 3 | 10 |
|  | LWL4 | PG4 | 4 | 12 |
| WL2 | LWL1 | PG5 | 5 | 14 |
|  | LWL2 | PG6 | 7 | 16 |
|  | LWL3 | PG7 | 9 | 18 |
|  | LWL4 | PG8 | 11 | 20 |
| WL3 | LWL1 | PG9 | DUMMY | CLOSE |
|  | LWL2 | PG10 | DUMMY | CLOSE |
|  | LWL3 | PG11 | DUMMY | CLOSE |
|  | LWL4 | PG12 | DUMMY | CLOSE |
| WL4 | LWL1 | PG13 | New1 | ⋮ |
|  | LWL2 | PG14 | New2 |  |
|  | LWL3 | PG15 | New3 |  |
|  | LWL4 | PG16 | New4 |  |

⋮

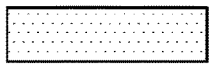 PROGRAM-COMPLETED PAGE

 PAGE REQUIRED TO BE PROGRAM-COMPLETED AFTER POWER OFF REQUEST

 DUMMY   PAGE ON WHICH DUMMY PROGRAM MUST BE PERFORMED AFTER POWER OFF REQUEST

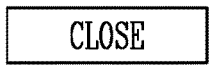 CLOSE   PAGE TO BE CLOSED AFTER ONLY DUMMY PROGRAM (FOGGY) IS PERFORMED AFTER POWER OFF REQUEST

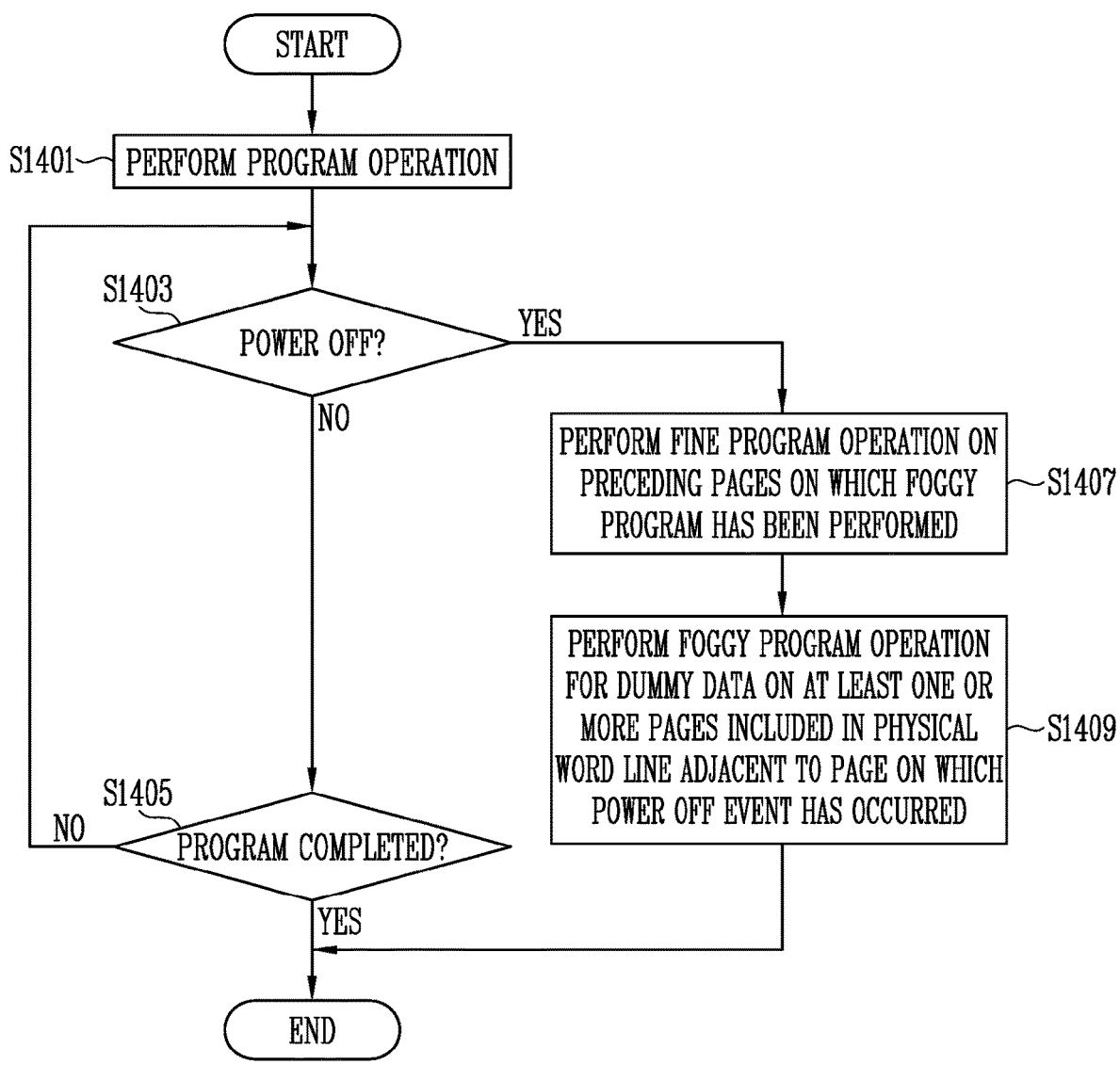

STORAGE DEVICE AND METHOD FOR FOGGY AND FINE PROGRAMMING

CROSS-REFERENCE TO RELATED APPLICATION

The present application claims priority under 35 U.S.C. § 119(a) to Korean patent application number 10-2019-0173802, filed on Dec. 24, 2019, which is incorporated herein by reference in its entirety.

BACKGROUND

Field of Invention

Various embodiments of the present invention disclosure generally relate to an electronic device and, more particularly, to a storage device capable of reducing the time it takes to perform a power off operation and to a method of operating the storage device.

Description of Related Art

Generally, a storage device is a device which stores data under control of a host device such as a computer or a smartphone. The storage device may include a memory device configured to store data, and a memory controller configured to control the memory device. Memory devices are chiefly classified into volatile memory devices and nonvolatile memory devices.

A volatile memory device is a memory device, which stores data only when power is supplied thereto, and in which data stored therein is lost when power is turned off. Examples of a volatile memory device may include a static random access memory (SRAM), and a dynamic random access memory (DRAM).

A non-volatile memory device may be a memory device that can retain data even when the power is turned off. Examples of the nonvolatile memory device may include a read-only memory (ROM), a programmable ROM (PROM), an electrically programmable ROM (EPROM), an electrically erasable programmable ROM (EEPROM), and a flash memory.

SUMMARY

Various embodiments of the present disclosure are directed to a storage device capable of reducing the time it takes to perform a power off operation, and a method of operating the storage device.

An embodiment of the present disclosure provides for a memory controller configured to control a memory device including a memory block coupled to physical word lines each including a plurality of pages. The memory controller may include: a program sequence information storage configured to store program sequence information of the plurality of pages; and a program controller configured to control the memory device such that, in response to a power off event occurring while a program operation is performed on a selected page among the plurality of pages, fine program operations are performed, based on the program sequence information, on to-be-completed pages that are pages which precede the selected page, and on which foggy program operations have been completed and on which the fine program operations have not yet been performed.

Another embodiment of the present disclosure provides for a memory device including: a memory block coupled to physical word lines each including a plurality of pages; a peripheral circuit configured to perform a program operation of storing data in the plurality of pages; a control logic configured to control the peripheral circuit. The program operation may include a foggy program operation of programming memory cells included in the plurality of pages so that each of the memory cells has a threshold voltage corresponding to any one of intermediate states respectively corresponding to a plurality of states, and a fine program operation of programming the memory cells having the threshold voltages corresponding to the intermediate states so that each of the memory cells has a threshold voltage corresponding to any one of the plurality of states. The control logic may control the peripheral circuit to perform the foggy program operation on one page of a plurality of pages included in a selected physical word line among the physical word lines and then perform the fine program operation on one page of a plurality of pages included in a physical word line on which the foggy program operation has been performed in a sequence preceding the selected physical word line.

Yet another embodiment of the present disclosure provides for a storage device including: a memory device comprising a memory block coupled to physical word lines each including a plurality of pages; and a memory controller configured to control the memory device such that, in response to a power off event occurring while a program operation is performed on a selected page among the plurality of pages, fine program operations are performed on to-be-completed pages that are pages, which precede the selected page, and on which foggy program operations have been completed and on which the fine program operations have not yet been performed. The program operation may include the foggy program operation of programming memory cells included in the plurality of pages so that each of the memory cells has a threshold voltage corresponding to any one of intermediate states respectively corresponding to a plurality of states, and the fine program operation of programming the memory cells having the threshold voltages corresponding to the intermediate states so that each of the memory cells has a threshold voltage corresponding to any one of the plurality of states.

These and other features and advantages of the present invention will become apparent to those skilled in this art from the following detailed description and drawings.

BRIEF DESCRIPTION OF THE DRAWINGS

FIG. 10 is a diagram illustrating an example of program sequence information of FIG. 8.

FIG. 11 is a diagram describing a power off event which occurs when a program operation is performed according to the program sequence information in accordance with the embodiment of FIG. 10.

FIG. 12 is a diagram illustrating another example of the program sequence information of FIG. 8.

FIG. 13 is a diagram describing a power off event which occurs when a program operation is performed according to the program sequence information in accordance with the embodiment of FIG. 12.

FIG. 14 is a flowchart illustrating a method of operating a storage device in accordance with an embodiment of the present disclosure.

DETAILED DESCRIPTION

Specific structural or functional descriptions in the following embodiments of the present disclosure introduced in this specification should not be construed as being limited to the embodiments described in the specification or application.

Various embodiments of the present disclosure will now be described more fully hereinafter with reference to the accompanying drawings, in which preferred embodiments of the present disclosure are shown, so that those of ordinary skill in the art can easily carry out the present invention.

Figure 1:
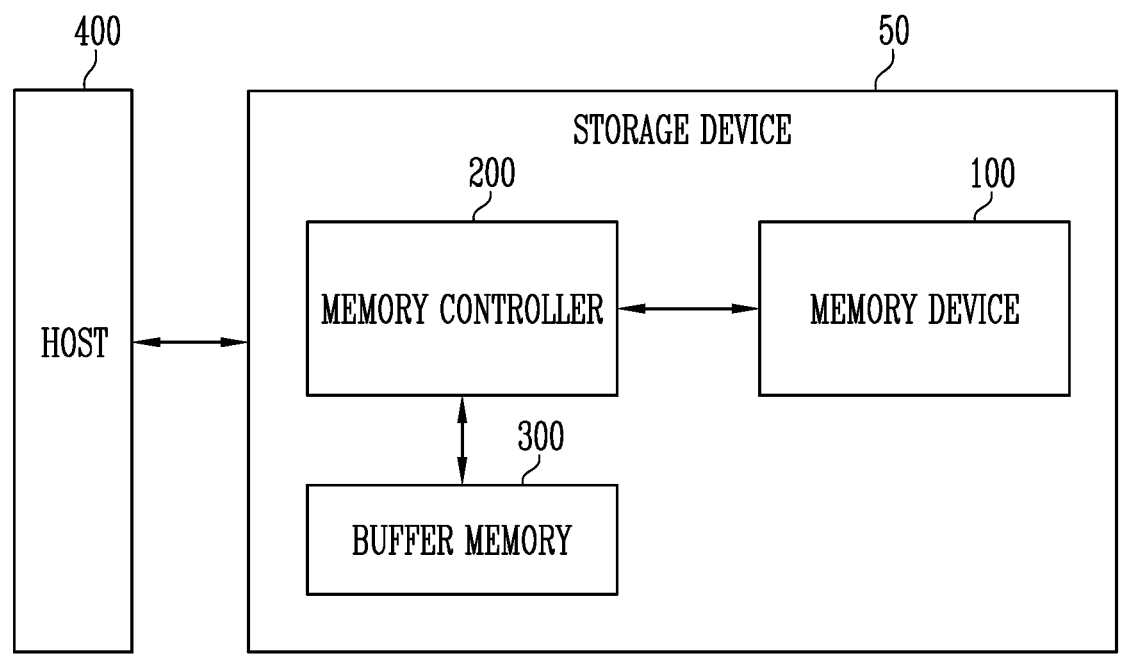
FIG. 1 is a block diagram illustrating a configuration of a storage device in accordance with an embodiment of the present disclosure.

FIG. 1 is a block diagram illustrating the configuration of a storage device 50 in accordance with an embodiment of the present disclosure.

Referring to FIG. 1, the storage device 50 may include a memory device 100, a memory controller 200, and a buffer memory 300.

The storage device 50 may be a device configured to store data under control of a host 400 such as a cellular phone, a smartphone, an MP3 player, a laptop computer, a desktop computer, a game machine, a TV, a tablet PC, or an in-vehicle infotainment system.

The storage device 50 may be implemented as any one of various storage devices depending on a host interface, which is a communication system with the host 400. For example, the storage device 50 may be configured as any one of various storage devices such as an SSD, MMC, eMMC, RS-MMC, or micro-MMC type multimedia card, an SD, mini-SD, micro-SD type secure digital card, a universal serial bus (USB) storage device, a universal flash storage (UFS) device, a personal computer memory card international association (PCMCIA) card type storage device, a peripheral component interconnection (PCI) card type storage device, a PCI-express (PCI-E) type storage device, a compact flash (CF) card, a smart media card, and a memory stick.

The storage device 50 may be manufactured in the form of any one of various package types. For instance, the storage device 50 may be manufactured in the form of any one of various package types such as a package on package (POP) type, a system in package (SIP) type, a system on chip (SOC) type, a multi-chip package (MCP) type, a chip on board (COB) type, a wafer-level fabricated package (WFP) type, and a wafer-level stack package (WSP) type.

The memory device 100 may store data therein. The memory device 100 may operate under control of the memory controller 200. The memory device 100 may include a plurality of planes. Each of the planes may be an area which may be independently operated. Each plane may perform any one operation of a program operation, a read operation, and an erase operation.

The memory device 100 may include a memory cell array including a plurality of memory cells configured to store data therein. The memory cell array may include a plurality of memory blocks. Each memory block may include a plurality of memory cells. Each memory block may be the unit for performing an operation of erasing data from the memory device 100. In other words, pieces of data stored in the same memory block may be simultaneously erased. In an embodiment, the memory block may include a plurality of pages. The page may be the unit of storing data in the memory device 100, or reading data from the memory device 100. That is, a physical address that is provided from the memory controller 200 to the memory device 100 during a program operation or a read operation may be an address for identifying a specific page.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In this specification, for the sake of description, the memory device 100 is a NAND flash memory.

In an embodiment, the memory device 100 may be embodied in a three-dimensional array structure. The present disclosure may be applied not only to a flash memory in which a charge storage layer is formed of a conductive floating gate (FG), but also to a charge trap flash (CTF) memory in which a charge storage layer is formed of an insulating layer.

In an embodiment, each of the memory cells included in the memory device 100 may be operated in the form of any one of a single-level cell (SLC) capable of storing a single data bit or a multi-level cell (MLC) capable of storing two or more data bits. For example, the MLC may refer to a MLC capable of storing two data bits, a triple-level cell (TLC) capable of storing three data bits, a quad-level cell (QLC) capable of storing four data bits, or a memory cell formed of a scheme that is capable of storing five or more data bits.

The memory controller 200 may control overall operations of the storage device 50. When power is applied to the storage device 50, the memory controller 200 may execute firmware (FW). In the case where the memory device 100 is a flash memory device, the memory controller 200 may execute firmware such as a flash translation layer (FTL) for controlling communication between the host 400 and the memory device 100.

If a write request is received from the host 400, the memory controller 200 may receive, from the host 400, write data to be stored in the memory device 100 and a logical address (LA) for identifying the corresponding write data. The memory controller 200 may translate the input logical address into a physical address (PA) indicating physical addresses of memory cells in which the write data is to be stored among the memory cells included in the memory device 100. In an embodiment, each logical address may correspond one-to-one to one physical address. Alternatively, each logical address may correspond to a plurality of physical addresses. The memory controller 200 may provide a program command for storing data, a physical address, and write data to the memory device 100.

In an embodiment, if a read request is received from the host 400, the memory controller 200 may receive, from the host 400, a logical address corresponding to the read request from the host 400. Here, the logical address corresponding to the read request may be a logical address for identifying read-requested data. The memory controller 200 may obtain a physical address mapped to a logical address corresponding to a read request from map data indicating a corresponding relationship between logical addresses provided from the host and physical addresses of the memory device 100. Subsequently, the memory controller 200 may provide a read command and a physical address to the memory device 100. In various embodiments, during an erase operation, the memory controller 200 may provide, to the memory device 100, an erase command and a physical address of a memory block to be erased.

In an embodiment, the memory controller 200 may autonomously control the memory device 100 to perform a program operation, a read operation, or an erase operation regardless of a request from the host 400. For example, the memory controller 200 may control the memory device 100 to perform background operations such as a wear leveling operation, a garbage collection operation, and a read reclaim operation.

In an embodiment, the memory controller 200 may store, in the buffer memory 300, data received from the host 400 or data to be provided to the host 400. Alternatively, the memory controller 200 may store, in the buffer memory 300, data to be provided to the memory device 100 or data provided from the memory device 100.

In an embodiment, the memory controller 200 may temporarily store system data for controlling the memory device 100 to the buffer memory 300. Alternatively, the memory controller 200 may temporarily store, in the buffer memory 300, data input from the host 400, and thereafter transmit the data temporarily stored in the buffer memory 300 to the memory device 100.

In an embodiment, the buffer memory 300 may be used as an operating memory or a cache memory of the memory controller 200. The buffer memory 300 may store codes or commands to be executed by the memory controller 200. Alternatively, the buffer memory 300 may store data to be processed by the memory controller 200.

In an embodiment, the memory controller 200 may store the map data in the buffer memory 300.

In an embodiment, the buffer memory 300 may be formed of a volatile memory device. In an embodiment, the buffer memory 300 may be embodied by an SRAM or a DRAM such as a double data rate synchronous dynamic random access memory (DDR SDRAM), a DDR4 SDRAM, a low power double data rate4 (LPDDR4) SDRAM, a graphics double data rate (GDDR) SDRAM, a low power DDR (LPDDR), or a rambus dynamic random access memory (RDRAM).

In an embodiment, the storage device 50 may not include the buffer memory 300. In this case, one or more volatile memory devices provided outside the storage device 500 may perform the function of the buffer memory 300.

While a program operation of storing data in the memory device 100 is performed, the power applied to the storage device 50 may be turned off. This event may be referred to as a sudden power off (SPO) event or a sudden power loss (SPL) event. If a SPO event occurs, the storage device 50 may use auxiliary power to complete the program operation that is being performed. Alternatively, the storage device 50 may complete the program operation and then store dummy data in a boundary page adjacent to a page on which the SPO event has occurred. In an embodiment, the storage device 50 may store dummy data in a plurality of pages to be programmed next to the page on which the SPO event has occurred. In an embodiment, the storage device 50 may further include an auxiliary power device which is used to complete the program operation that is being performed or to program the dummy data.

In an embodiment, when an SPO event occurs, the memory controller 200 may store power off information. The power off information may include at least one of information about a page on which the SPO event has occurred, information about a page in which the dummy data is stored, and information about a page on which a subsequent program operation is to be performed. Thereafter, when power to the storage device 50 is re-established, the memory controller 200 may load the power off information.

In an embodiment, the memory controller 200 may control at least two or more memory devices 100. For example, the memory controller 200 may control two or more memory devices 100 in an interleaving manner so as to enhance the operating performance.

The host 400 may communicate with the storage device 50 using at least one of various communication methods such as universal serial bus (USB), serial AT attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

Figure 2:
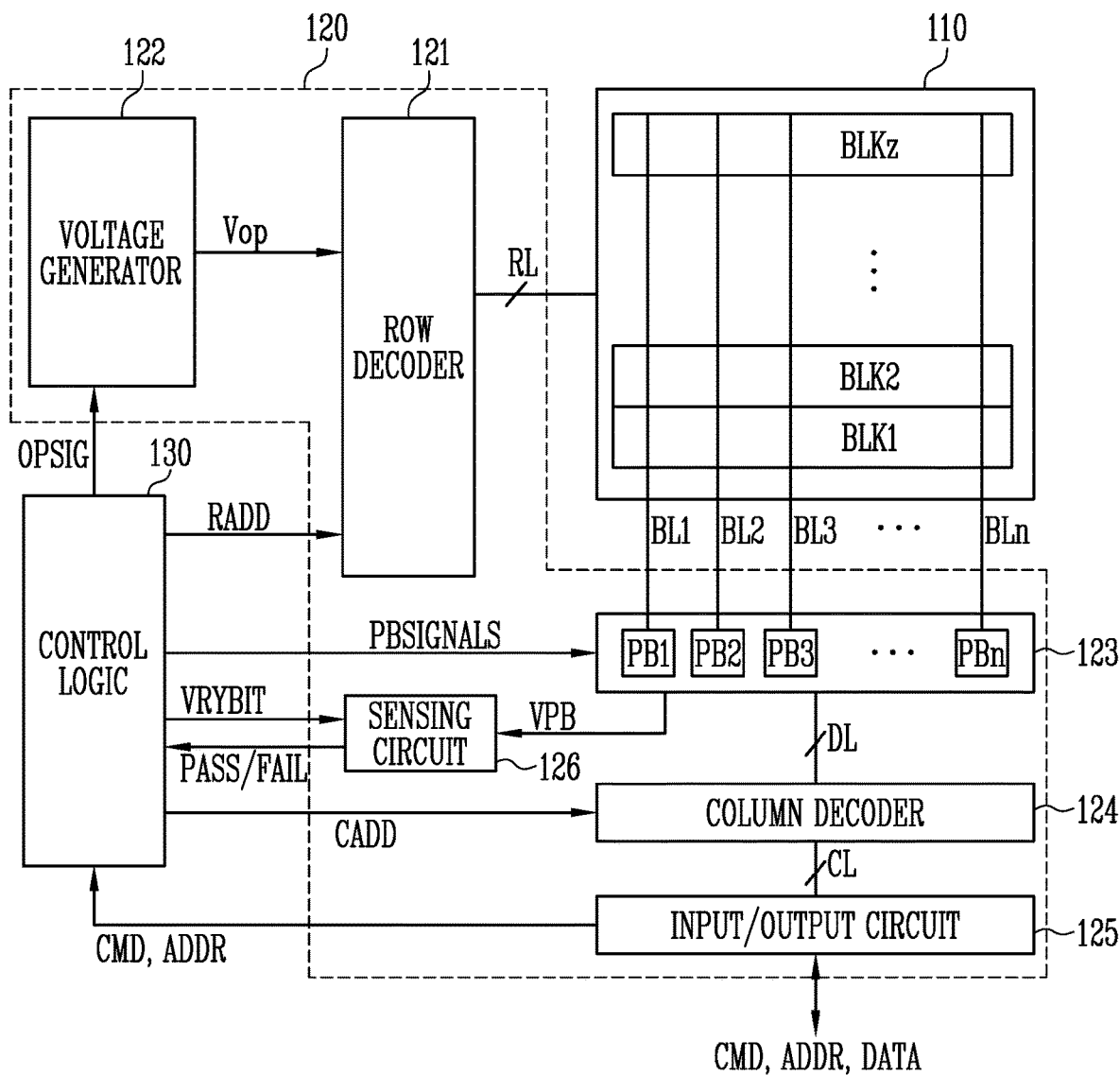
FIG. 2 is a block diagram illustrating describing a configuration of a memory device 100 of FIG. 1.

FIG. 2 is a diagram describing a configuration of the memory device 100 of FIG. 1.

Referring to FIG. 2, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz are coupled to a row decoder 121 through row lines RL. The plurality of memory blocks BLK1 to BLKz may be coupled to a page buffer group 123 through bit lines BL1 to BLn. Each of the memory blocks BLK1 to BLKz may include a plurality of memory cells. In an embodiment, the plurality of memory cells may be nonvolatile memory cells. Memory cells coupled to the same word line may be defined as one page. Hence, each memory block may include a plurality of pages. In an embodiment, memory cells coupled to one word line may include a plurality of pages.

Each of the memory cells included in the memory cell array 110 may be formed of a single-level cell (SLC) capable of storing a single data bit or a multi-level cell (MLC) capable of storing two or more data bits. For example, the MLC may refer to a MLC capable of storing two data bits, a triple-level cell (TLC) capable of storing three data bits, a quad-level cell (QLC) capable of storing four data bits, or a memory cell formed of a scheme capable of storing five or more data bits.

The peripheral circuit 120 may perform a program operation, a read operation, or an erase operation on a selected area of the memory cell array 110 under control of the control logic 130. The peripheral circuit 120 may drive the memory cell array 110. For example, the peripheral circuit 120 may apply various operating voltages to the row lines RL and the bit lines BL1 to BLn or discharge the applied voltages, under control of the control logic 130.

The peripheral circuit 120 may include the row decoder 121, a voltage generator 122, the page buffer group 123, a column decoder 124, and an input/output circuit 125.

The row decoder 121 is coupled to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 may operate under control of the control logic 130. The row decoder 121 may receive a row address RADD from the control logic 130.

The row decoder 121 may decode the row address RADD. The row decoder 121 may select at least one memory block of the memory blocks BLK1 to BLKz in response to the decoded address. The row decoder 121 may select at least one word line WL of the selected memory block in response to the decoded address so that voltages generated from the voltage generator 122 are applied to the at least one word line WL.

For example, during a program operation, the row decoder 121 may apply a program voltage to a selected word line and apply a program pass voltage having a level lower than that of the program voltage to unselected word lines. During a program verify operation, the row decoder 121 may apply a verify voltage to a selected word line and apply a verify pass voltage higher than the verify voltage to unselected word lines. During a read operation, the row decoder 121 may apply a read voltage to a selected word line and apply a read pass voltage higher than the read voltage to unselected word lines.

In an embodiment, an erase operation of the memory device 100 may be performed on a memory block basis. During an erase operation, the row decoder 121 may select one memory block in response to a decoded address. During the erase operation, the row decoder 121 may apply a ground voltage to word lines coupled to the selected memory block.

The voltage generator 122 may operate under control of the control logic 130. The voltage generator 122 may generate a plurality of voltages using an external supply voltage supplied to the memory device 100. In detail, the voltage generator 122 may generate various operating voltages Vop to be used for a program operation, a read operation, and an erase operation in response to an operating signal OPSIG. For example, the voltage generator 122 may generate a program voltage, a verify voltage, a pass voltage, a read voltage, an erase voltage, and so forth under control of the control logic 130.

In an embodiment, the voltage generator 122 may generate an internal supply voltage by regulating an external supply voltage. The internal supply voltage generated from the voltage generator 122 may be used as an operating voltage of the memory device 100.

In an embodiment, the voltage generator 122 may generate a plurality of voltages using an external power supply voltage or an internal power supply voltage.

For example, the voltage generator 122 may include a plurality of pumping capacitors for receiving the internal supply voltage and generate a plurality of voltages by selectively activating the plurality of pumping capacitors under control of the control logic 130.

The generated voltages may be supplied to the memory cell array 110 by the row decoder 121.

The page buffer group 123 may include first to n-th page buffers PB1 to PBn. The first to n-th page buffers PB1 to PBn are coupled to the memory cell array 110 through the first to n-th bit lines BL1 to BLn, respectively. The first to n-th page buffers PB1 to PBn may operate under control of the control logic 130. In detail, the first to n-th page buffers PB1 to PBn may operate in response to page buffer control signals PBSIGNALS. For instance, the first to n-th page buffers PB1 to PBn may temporarily store data received through the first to n-th bit lines BL1 to BLn, or sense voltages or currents of the first to n-th bit lines BL1 to BLn during a read operation or a verify operation.

In detail, during a program operation, the first to n-th page buffers PB1 to PBn may transmit data received through the column decoder 124 and the input/output circuit 125 to selected memory cells through the first to n-th bit lines BL1 to BLn when a program voltage is applied to a selected word line. The memory cells in the selected page are programmed based on the transmitted data DATA. A memory cell coupled to a bit line to which a program enable voltage (e.g. a ground voltage) is applied may have an increased threshold voltage. The threshold voltage of a memory cell coupled to a bit line to which a program inhibit voltage (for example, a supply voltage) is applied may be retained. During a program verify operation, the first to n-th page buffers PB1 to PBn may sense data stored in selected memory cells through the first to n-th bit lines BL1 to BLn.

During a read operation, the first to n-th page buffers PB1 to PBn may sense data DATA from memory cells of a selected page through the first to n-th bit lines BL1 to BLn, and output the sensed data DATA to the data input/output circuit 125 under control of the column decoder 124.

During an erase operation, the first to n-th page buffers PB1 to PBn may float the first to n-th bit lines BL1 to BLn.

The column decoder 124 may transmit data between the input/output circuit 125 and the page buffer group 123 in response to a column address CADD received from the control logic 130. For example, the column decoder 124 may exchange data with the first to n-th page buffers PB1 to PBn through data lines DL, or exchange data with the input/output circuit 125 through column lines CL.

The input/output circuit 125 may transmit, to the control logic 130, a command CMD or an address ADDR received from the memory controller 200 described with reference to FIG. 1. The input/output circuit 125 may exchange data DATA with the column decoder 124.

During a read operation or a verify operation, the sensing circuit 126 may generate a reference current in response to an enable bit signal VRYBIT received from the control logic 130, and may compare a sensing voltage VPB received from the page buffer group 123 with a reference voltage generated by the reference current and output a pass signal PASS or a fail signal FAIL to the control logic 130.

The control logic 130 may output an operating signal OPSIG to the voltage operator 122, a row address RADD to the row decoder 121, page buffer control signals PBSIG-NALS to the page buffer group 123, and an enable bit signal VRYBIT to the sensing circuit 126 in response to a command CMD and an address ADD received by the input/output circuit 125 for controlling the peripheral circuit 120. In addition, the control logic 130 may determine whether a target memory cell has passed a verification during a verify operation in response to a pass signal PASS or a fail signal FAIL received from the sensing circuit 126.

Figure 3:
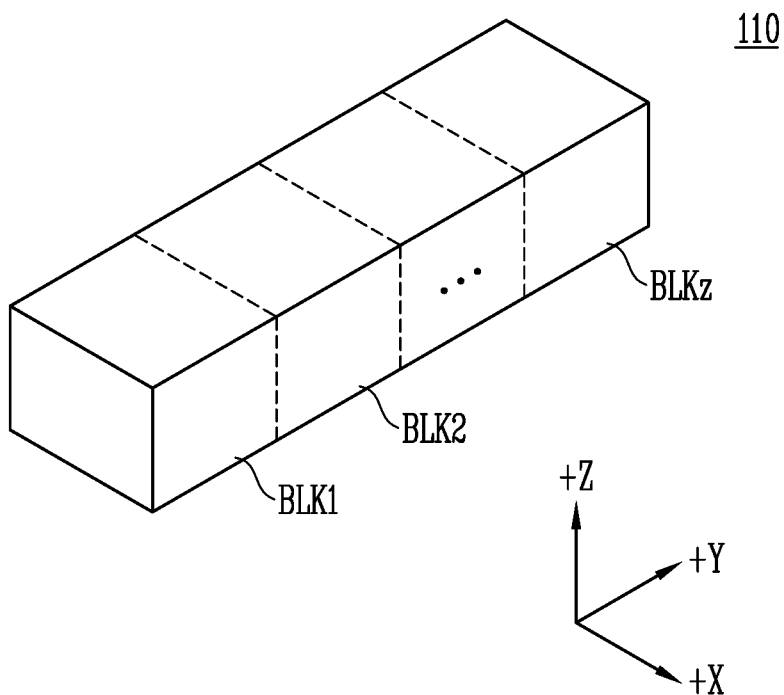
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate. The memory cells may be arranged in an +X direction, a +Y direction, and a +Z direction. Examples of the structure of each memory block will be described in more detail with reference to FIGS. 4 and 5.

Figure 4:
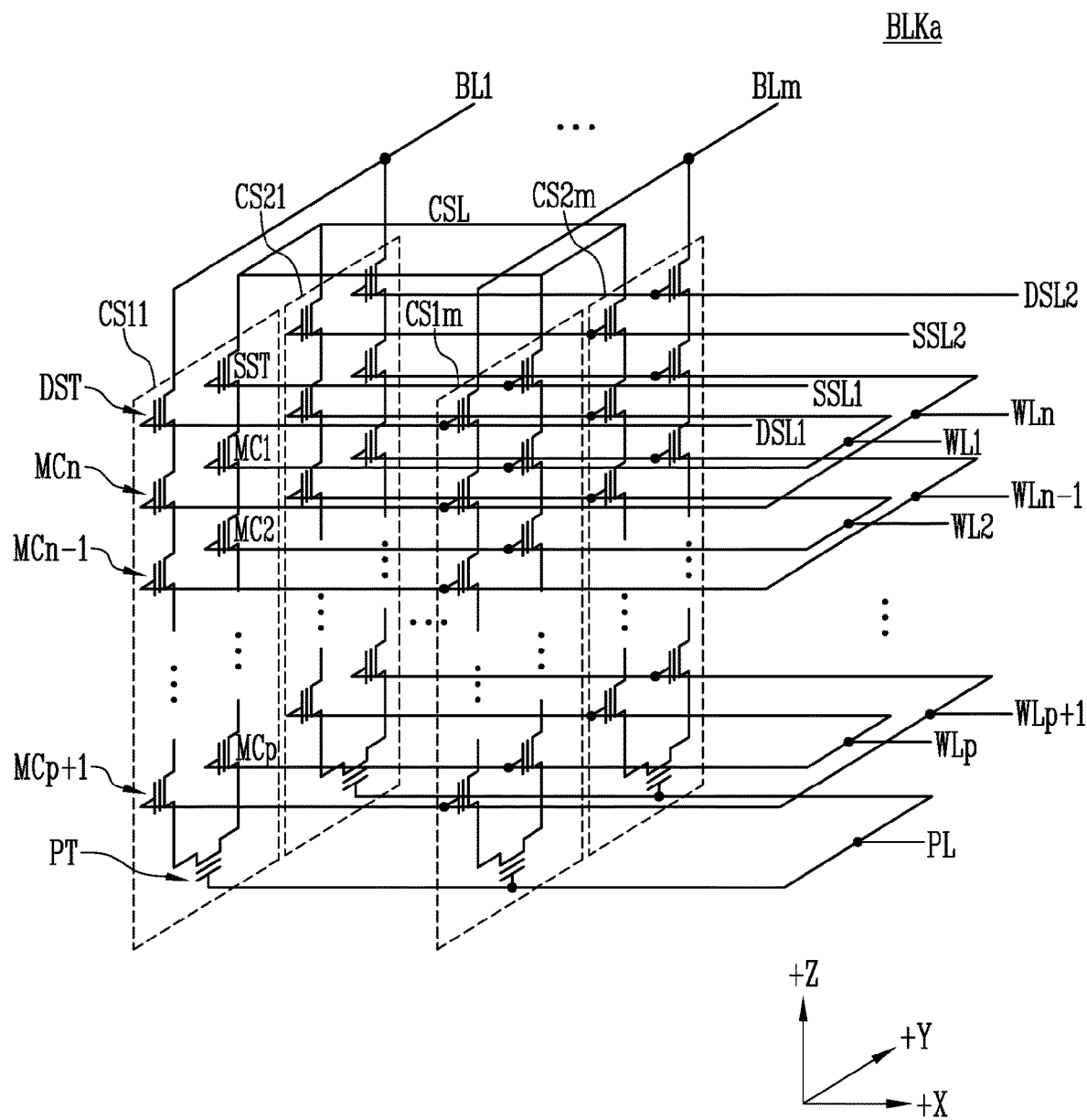
FIG. 4 is a circuit diagram illustrating any one memory block BLKa of memory blocks BLK1 to BLKz of FIG. 3, in accordance with an embodiment of the present disclosure.

FIG. 4 is a circuit diagram illustrating any one memory block BLKa of memory blocks BLK1 to BLKz of FIG. 3.

Referring to FIG. 4, the memory block BLKa may include a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings may be arranged in a row direction (i.e., the +X direction). In FIG. 4, two cell strings are illustrated as being arranged in a column direction (i.e., the +Y direction). However, this illustration is made only for convenience of description, and it will be understood that three or more cell strings may be arranged in the column direction.

Each of the plurality of cell strings CS11 to CS1m and CS21 to CS2m may include at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 4, source select transistors of the cell strings CS11 to CS1m in a first row are coupled to a first source select line SSL1. Source select transistors of the cell strings CS21 to CS2m in a second row are coupled to a second source select line SSL2.

In an embodiment, the source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are successively arranged in a direction opposite to the +Z direction and are coupled in series between the source select transistor SST and the pipe transistor PT. The p+1-th to n-th memory cells MCp+1 to MCn are successively arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

Respective gates of the pipe transistors PT of the cell strings are coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1m in the first row are coupled to a first drain select line DSL1. Drain select transistors of the cell strings CS21 to CS2m in the second row are coupled to a second drain select line DSL2.

Cell strings arranged in the column direction may be coupled to bit lines extending in the column direction. In FIG. 4, cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form another single page. When any one of the drain select lines DSL1 and DSL2 is selected, corresponding cell strings arranged in the direction of a single row may be selected. When any one of the word lines WL1 to WLn is selected, a corresponding single page may be selected from among the selected cell strings.

In an embodiment, even bit lines and odd bit lines may be provided in lieu of the first to m-th bit lines BL1 to BLm. Even-number-th cell strings of the cell strings CS11 to CS1m or CS21 to CS2m arranged in the row direction may be coupled to respective even bit lines. Odd-number-th cell strings of the cell strings CS11 to CS1m or CS21 to CS2m arranged in the row direction may be coupled to respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCp. Alternatively, at least one or more dummy memory cells may be provided to reduce an electric field between the drain select transistor DST and the memory cells MCp+1 to MCn. As the number of dummy memory cells is increased, the reliability in operation of the memory block BLKa may be increased, while the size of the memory block BLKa may be increased. As the number of dummy memory cells is reduced, the size of the memory block BLKa may be reduced, but the reliability in operation of the memory block BLKa may be reduced.

To efficiently control the at least one dummy memory cells, each of the dummy memory cells may have a required threshold voltage. Before or after an erase operation on the memory block BLKa is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 5:
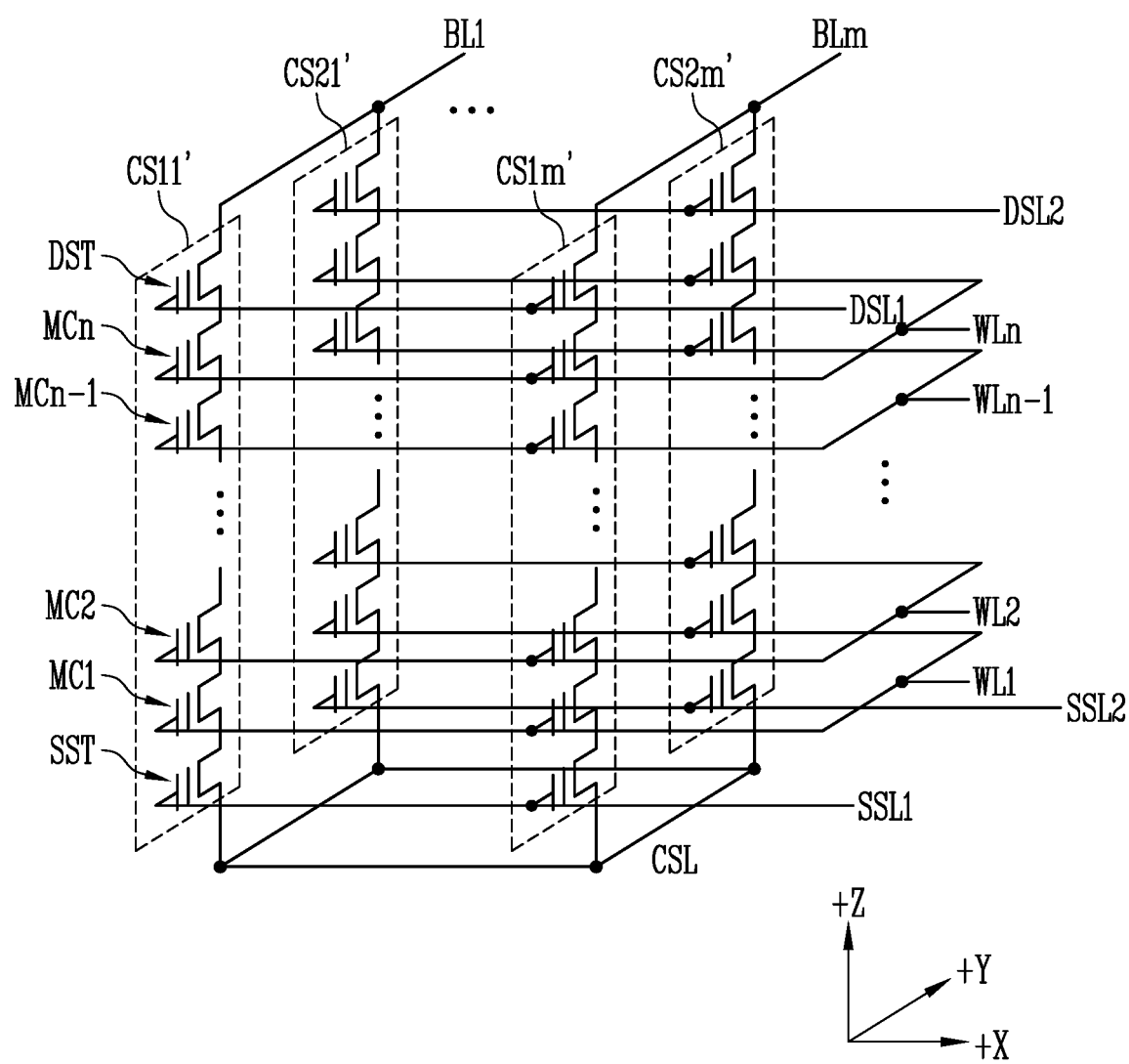
FIG. 5 is a circuit diagram illustrating any one memory block BLKb of memory blocks BLK1 to BLKz of FIG. 3, in accordance with another embodiment of the present disclosure.

FIG. 5 is a circuit diagram illustrating any one memory block BLKb of memory blocks BLK1 to BLKz of FIG. 3.

Referring to FIG. 5, the memory block BLKb may include a plurality of cell strings CS11' to CS1m' and CS21' to CS2m'. Each of the cell strings CS11' to CS1m' and CS21' to CS2m' extends in the +Z direction. Each of the cell strings CS11' to CS1m' and CS21' to CS2m' may include at least one source select transistor SST, first to n-th memory cells MC1 to MCn, and at least one drain select transistor DST which are stacked on a substrate (not shown) provided in a lower portion of the memory block BLKb.

The source select transistor SST of each cell string is coupled between the common source line CSL and the memory cells MC1 to MCn. The source select transistors of cell strings arranged in the same row are coupled to the same source select line. Source select transistors of the cell strings CS11' to CS1m' arranged in a first row may be coupled to a first source select line SSL1. Source select transistors of the cell strings CS21' to CS2m' arranged in a second row may be coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. Drain select transistors of cell strings arranged in the row direction may be coupled to drain select lines extending in the row direction. Drain select transistors of the cell strings CS11' to CS1m' in the first row are coupled to a first drain select line DSL1. Drain select transistors of the cell strings CS21' to CS2m' in the second row may be coupled to a second drain select line DSL2.

Consequently, the memory block BLKb of FIG. 5 may have an equivalent circuit similar to that of the memory block BLKa of FIG. 4 except that a pipe transistor PT is excluded from each cell string.

In an embodiment, even bit lines and odd bit lines may be provided in lieu of the first to m-th bit lines BL1 to BLm. Even-number-th cell strings among the cell strings CS11' to CS1m' or CS21' to CS2m' arranged in the row direction may be coupled to the respective even bit lines, and odd-number-th cell strings among the cell strings CS11' to CS1m' or CS21' to CS2m' arranged in the row direction may be coupled to the respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCn. Alternatively, at least one or more dummy memory cells may be provided to reduce an electric field between the drain select transistor DST and the memory cells MC1 to MCn. As the number of dummy memory cells is increased, the reliability in operation of the memory block BLKb may be increased, while the size of the memory block BLKb may be increased. As the number of dummy memory cells is reduced, the size of the memory block BLKb may be reduced, but the reliability in operation of the memory block BLKb may be reduced.

To efficiently control the at least one dummy memory cells, each of the dummy memory cells may have a required threshold voltage. Before or after an erase operation on the memory block BLKb is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 6:
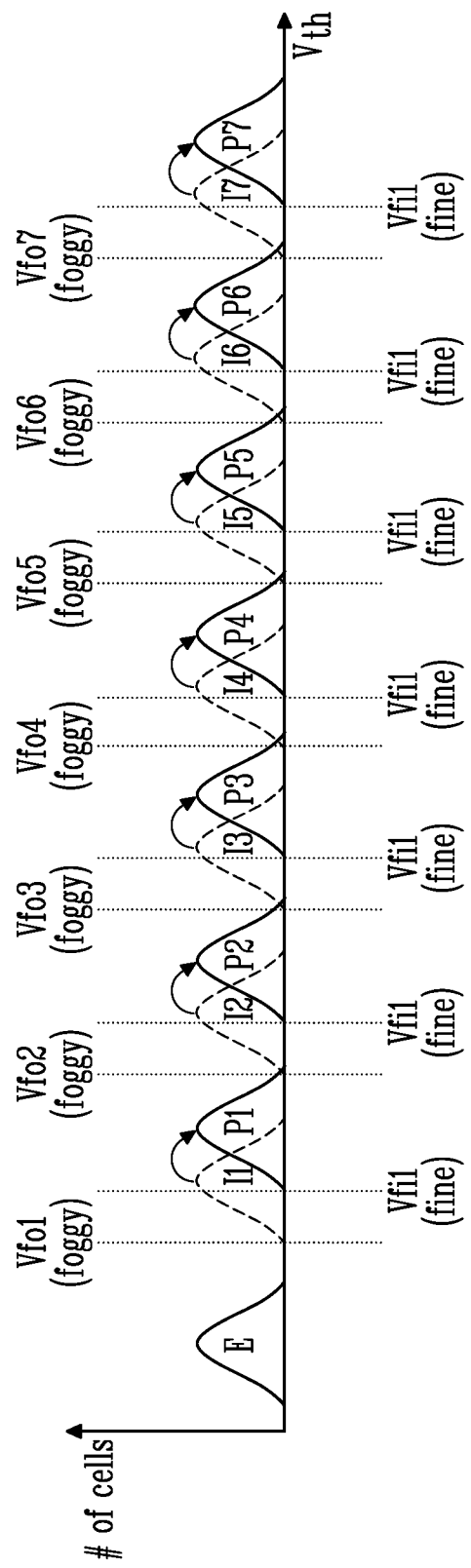
FIG. 6 is a diagram describing a foggy-fine program operation.

FIG. 6 is a diagram describing a foggy-fine program operation.

Referring to FIG. 6, a horizontal axis indicates a threshold voltage for memory cells, and a vertical axis indicates the number of memory cells. In the embodiment of FIG. 6, each memory cell may be formed of a TLC capable of storing 3-bit data. The memory device may perform a program operation using TLCs and store 3-bit data in each memory cell.

Each memory cell may store data by performing a foggy program operation and a fine program operation. FIG. 6 is a diagram illustrating threshold voltage distributions formed when the foggy program operation and the fine program operation are performed on memory cells of one page. In detail, dashed lines indicate threshold voltage distributions of the memory cells after the foggy program operation has been performed. Solid lines indicate threshold voltage distributions of the memory cells after the fine program operation has been performed.

The program operation may be divided into the foggy program operation and the fine program operation. In other words, the foggy program operation and the fine program operation may be needed to be performed to complete the program operation on the memory cells. If the program operation is completed, each memory cell may have a threshold voltage corresponding to any one of a plurality of programmed states distinguished from each other depending on data to be stored in the corresponding memory cell.

For example, each memory cell may be eventually programmed to any one state of an erased state E and first to seventh programmed states P1 to P7. Programming of a memory cell means that the memory cell has a threshold voltage that belongs to a threshold voltage distribution of a corresponding state.

Each of the memory cells may have a threshold voltage that belongs to a threshold voltage distribution of any one of the erased state E and the first to seventh intermediate states I1 to I7 by the foggy program operation. For example, a memory cell to be programmed to the first programmed state P1 may have a threshold voltage of a first intermediate state I1. Memory cells to be programmed to the second to seventh programmed states P2 to P7 may respectively have threshold voltages corresponding to the second to seventh intermediate states I2 to I7.

During a foggy program operation, a verify operation using foggy verify voltages Vfo1 to Vfo7 may be performed. During a fine program operation, a verify operation using fine verify voltages Vfi1 to Vfi7 may be performed.

After a foggy program operation has been performed, a fine program operation may be performed. A fine program operation is an operation of programming memory cells such that each memory cell has a threshold voltage corresponding to a state pertaining to data to be stored in the memory cell. If the fine program operation is performed, each of the memory cells may have a threshold voltage corresponding to any one state of the erased status E and the first to seventh programmed states P1 to P7.

In an embodiment, a foggy program operation may be performed on any one page, and then, before a fine program operation is performed on the corresponding page, a foggy program operation may be performed on another page. The reason for this is that, if the foggy program operation and the fine program operation are successively performed on same page (same word line), the threshold voltage of the memory cell may be increased by disturb as a result of performing two program operations on the same word line.

Figure 7:
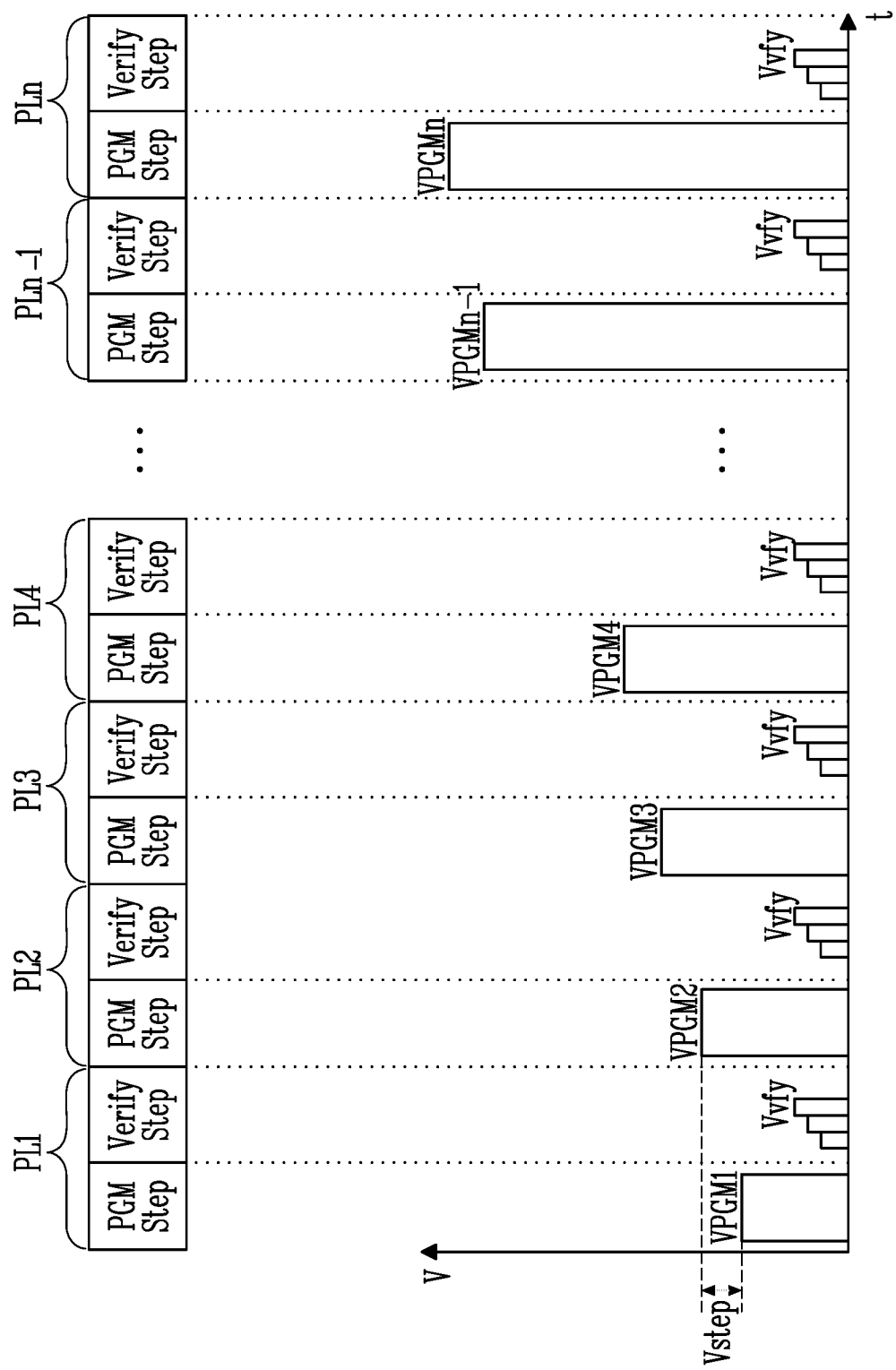
FIG. 7 is a diagram describing a program operation according to an incremental step pulse program (ISPP) scheme.

FIG. 7 is a diagram describing a program operation according to an incremental step pulse program (ISPP) scheme.

Referring to FIG. 7, the program operation may include a plurality of program loops PL1 to PLn. Each of the program loops may include a program voltage application step PGM STEP and a verify step VERIFY STEP. The program operation may be performed by iteration of a plurality of program loops until the verify step passes.

While the program loops iterate, program voltage VGPM and verify voltages Vvfy may be repeatedly applied to a selected word line. In an embodiment, the foggy program operation and the fine program operation that are described with reference to FIG. 6 may be performed in the same manner as the program operation of FIG. 7.

Each time the program loop iterates, the level of the program voltage to be applied to the selected word line may increase. Here, the level of the program voltage to be applied to the word line may increase by a preset step voltage VSTEP. This scheme is referred to as "incremental step pulse program (ISPP) scheme".

Figure 8:
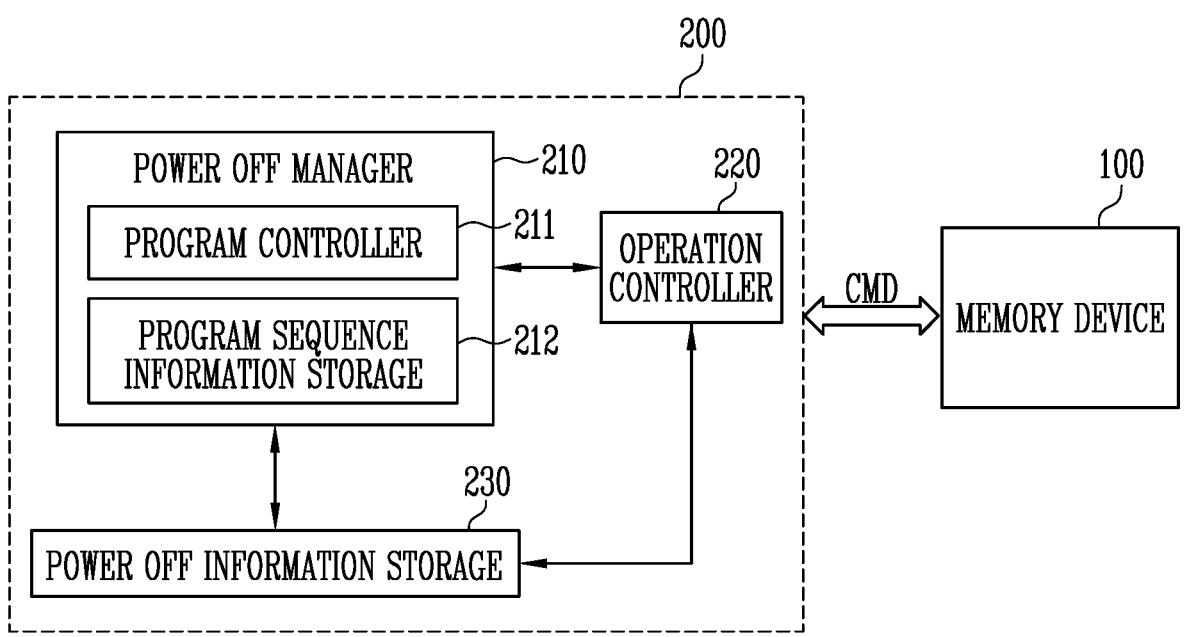
FIG. 8 is a block diagram illustrating the structure of a memory controller in accordance with an embodiment of the present disclosure.

FIG. 8 is a diagram illustrating the structure of the memory controller in accordance with an embodiment of the present disclosure.

Referring to FIG. 8, the memory controller 200 may include a power off manager 210, an operation controller 220, and a power off information storage 230.

The power off manager 210 may include a program controller 211 and a program sequence information storage 212.

The power off manager 210 may control a program operation when a power off event occurs. The power off event may include not only an SPO or SPL event in which the power supply to the memory device 100 and the memory controller 200 is suddenly interrupted, but also a normal power off event in which the power supply is normally turned off while the program operation is performed.

If a power off event occurs while the program operation is performed, the program controller 211 may obtain, from the operation controller 220, information on the page on which a program operation is interrupted due to the power off event. The program controller 211 may acquire to-be-completed page information that is information of a page on which the program operation is to be completed, based on the information of the page on which the program operation is interrupted due to the power off event and program sequence information stored in the program sequence information storage 212. The to-be-completed page may be a page on which a foggy program operation has already been performed and a fine program operation has not yet performed.

The program controller 211 may control the operation controller 220 to perform a dummy program operation of storing dummy data in each of at least one or more boundary pages adjacent to the to-be-completed page after the program operation has been completed. In an embodiment, the dummy program operation may include only the foggy program operation.

In an embodiment, the number of boundary pages on which the dummy program operations are to be performed may be stored in advance. In an embodiment, the number of boundary pages on which the dummy program operations are to be performed may correspond to the number of logical word lines coupled to one physical word line.

In an embodiment, the program controller 211 may store the power off information in the power off information storage 230 after the dummy program operations have been completed. The power off information may include at least one of information of a page on which a program operation is interrupted due to the power off event, information about a boundary page in which the dummy data is stored, and information about a page on which a subsequent program operation is to be performed. The power off information may be stored in the memory device 100 before the power supply to the storage device is interrupted.

The program sequence information storage 212 may include program sequence information of the memory cells included in the memory device 100. The program sequence information may include information about a sequence in which pages included in the memory device 100 are to be programmed by the unit of a page on which the program operation is performed. In an embodiment, each page may be programmed through the foggy program operation and the fine program operation that are described with reference to FIG. 6. In an embodiment, the program sequence information may include information about a sequence of the foggy program operation and the fine program operation to be performed on pages included in the memory device 100. When the memory controller 200 stores data in the memory device 100 in response to a write request from the host, the data may be stored according to the program sequence information.

Figure 9:
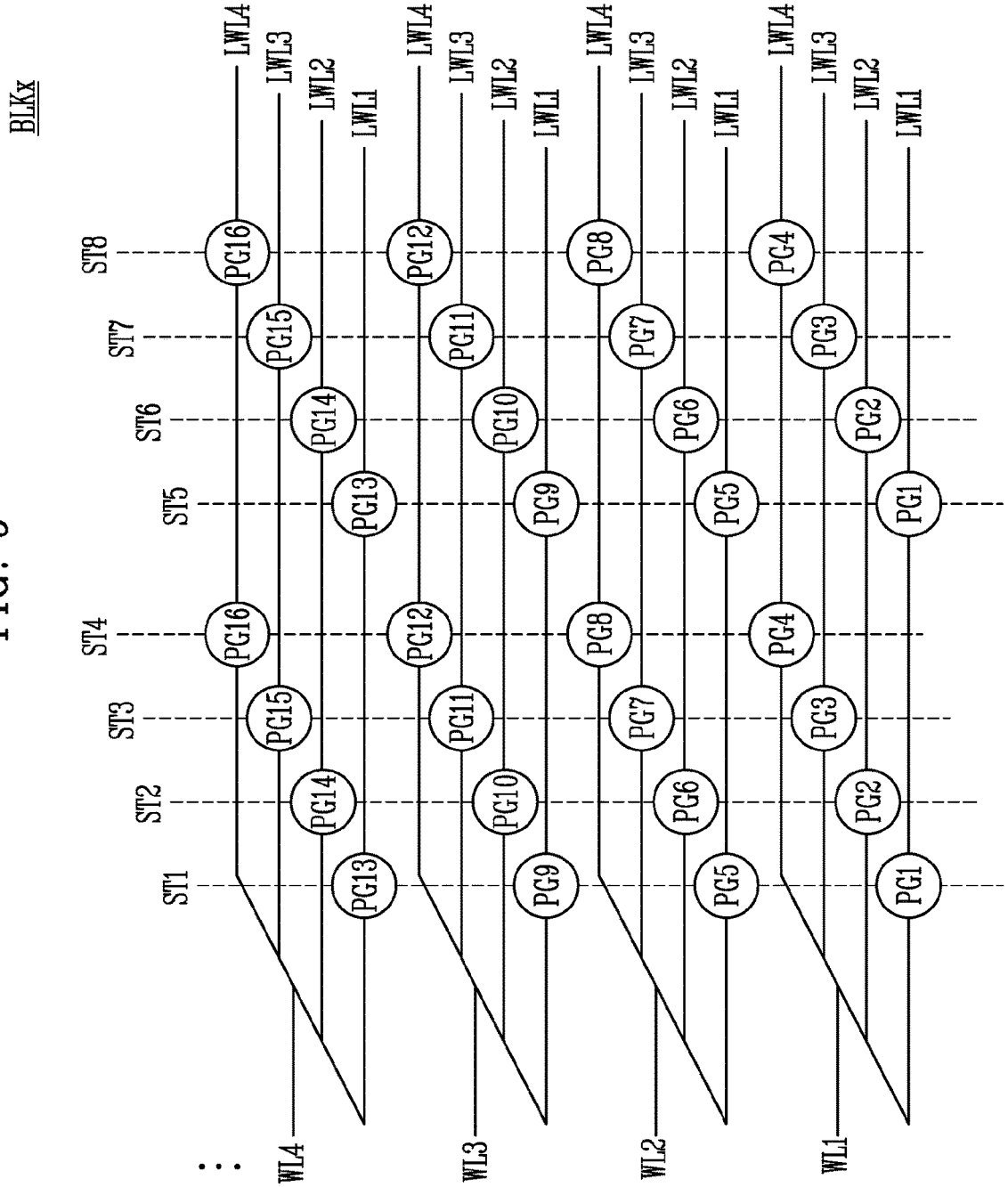
FIG. 9 is a diagram illustrating any one memory block BLKx of memory blocks of FIG. 3, in accordance with an embodiment of the present disclosure.

FIG. 9 is a diagram illustrating any one memory block BLKx of the memory blocks of FIG. 3, in accordance with an embodiment of the present disclosure.

FIG. 10 is a diagram illustrating an example of the program sequence information of FIG. 8.

Referring to FIG. 9, the memory block BLKx may be coupled to a plurality of physical word lines. Each physical word line may be coupled in common to four logical word lines. Memory cells coupled to any one of the logical word lines may form one page. For example, each of first to fourth physical word lines WL1 to WL4 may be coupled in common to first to fourth logical word lines LWL1 to LWL4.

In an embodiment, first to fourth strings ST1 to ST4 may be coupled in common to a first bit line. Fifth to eighth strings ST5 to ST8 may be coupled in common to a second bit line.

Although FIG. 9 illustrates an example where four strings included in one memory block is coupled to the same bit line and four logical word lines are coupled to one physical word line, this is only for illustrative purposes. The number of strings coupled in common to the same bit line and the number of logical word lines coupled to the same physical word line may be less or greater than four.

The number of logical word lines coupled to one physical word line may be determined depending on the number of strings coupled in common to one bit line. For example, if five strings are coupled in common to one bit line, five logical word lines may be coupled in common to one physical word line. In this case, one physical word line may include five pages. A string to be programmed and other strings among the five pages may be selected depending on a string select signal (e.g., signals applied to the drain select lines or the source select lines of FIG. 4 or 5).

The first logical word line LWL1 may be selected by the first string ST1 and the fifth string ST5. The second logical word line LWL2 may be selected by the second string ST2 and the sixth string ST6. The third logical word line LWL3 may be selected by the third string ST3 and the seventh string ST7. The fourth logical word line LWL4 may be selected by the fourth string ST4 and the eighth string ST8. One page may be selected by one logical word line and one physical word line.

In other words, the first physical word line WL1 may include first to fourth pages PG1 to PG4. The second physical word line WL2 may include fifth to eighth pages PG5 to PG8. The third physical word line WL3 may include ninth to twelfth pages PG9 to PG12. The fourth physical word line WL4 may include thirteenth to sixteenth pages PG13 to PG16.

Referring to FIG. 10, the program sequence information may include information about a program sequence of pages included in the memory block BLKx of FIG. 9.

Foggy program operations on first to fourth pages PG1 to PG4 may be sequentially performed (refer to numerals 1 to 4). Thereafter, foggy program operations on fifth to eighth pages PG5 to PG8 may be performed (refer to numerals 5 to 8) before fine program operations on the first to fourth pages PG1 to PG4 are performed. Subsequently, the fine program operations on the first to fourth pages PG1 to PG4 may be performed (refer to numerals 9 to 12). According to the program sequence in accordance with an embodiment of FIG. 10, after foggy program operations are sequentially performed on pages of each of a plurality of logical word lines included in a selected physical word line, fine program operations may be performed on pages of each of a plurality of logical word lines included in a physical word line, on which a foggy program operation has been performed, and which precedes the selected physical word line. In the case where data is stored according to the program sequence in accordance with the embodiment of FIG. 10, after a foggy program operation or a fine program operation is performed on one physical word line, a program operation is performed on a subsequent physical word line. Therefore, a change in threshold voltage due to program disturb or pass disturb between physical word lines may be reduced.

FIG. 11 is a diagram describing a power off event which occurs when a program operation is performed according to the program sequence information in accordance with the embodiment of FIG. 10.

Referring to FIGS. 8, and 9 to 11, the first to fourth pages PG1 to PG4 may be in a state in which both the foggy program operation and the fine program operation have been performed on each page (refer to numerals 1, 2, 3, 4, 9, 10, 11, and 12). The fifth to eighth pages PG5 to PG8 of the second physical word line WL2 may be in a state in which the foggy program operation has been completed (refer to numerals 5, 6, 7, and 8), and the ninth to twelfth pages PG9 to PG12 of the third physical word line WL3 may be in a state in which the foggy program operation has been performed on each page (refer to numerals 13, 14, 15, and 16). Thereafter, FIG. 11 illustrates that a power off event has occurred immediately before the fine program operation (refer to numeral 17) is performed on the fifth page PG5.

If the power off event occurs, the program controller 211 of the memory controller 200 may acquire information about a to-be-completed page, which is a page on which the program operation is to be completed. The to-be-completed page may be a page on which a foggy program operation has completed and a fine program operation is not yet performed. Therefore, the fifth to eighth pages PG5 to PG8 of the second physical word line WL2, and the ninth to twelfth pages PG9 to PG12 of the third physical word line WL3 may be to-be-completed pages.

The program controller 211 may control the memory device 100 to perform fine program operations on the fifth to eighth pages PG5 to PG8 of the second physical word line WL2 and the ninth to twelfth pages PG9 to PG12 of the third physical word line WL3.

Thereafter, the program controller 211 may control the memory device 100 to perform a dummy program operation of programming dummy data on each of at least one or more boundary pages of a physical word line adjacent to the second physical word line WL2 that is the physical word line on which the program operation is interrupted due to the power off event. Hence, the dummy program operation may be performed on each of the thirteenth to sixteenth pages PG13 to PG16 of the fourth physical word line WL4. The dummy program operation may be a program operation of storing dummy data. Therefore, the dummy program operation may also include a foggy program operation and a fine program operation.

Referring to FIG. 11, the foggy program operation and the fine program operation may be performed on the thirteenth to sixteenth pages PG13 to PG16 to store dummy data therein.

Subsequently, the program controller 211 may store power off information in the power off information storage 230. The power off information may include at least one of information about the page PG5 on which the program operation is interrupted due to the power off event, information about the boundary pages PG13 to PG16 in which the dummy data is stored, and information about the page PG17 on which a subsequent program operation is to be performed. The power off information may be stored in the memory device 100 before the power supply to the storage device is interrupted.

In the embodiment described with reference to FIG. 11, data stored in a program sequence in which, after all foggy program operations are performed on one physical word line, foggy program operations are performed on a subsequent physical word line. Hence, if a power off event occurs, the number of pages on which program operations must be completed may be relatively increased.

FIG. 12 is a diagram illustrating another example of the program sequence information of FIG. 8.

Referring to FIGS. 9 and 12, foggy program operations on first to fourth pages PG1 to PG4 may be sequentially performed (refer to numerals 1 to 4). Thereafter, a foggy program operation may be performed on the fifth page PG5 before a fine program operation is performed on the first page PG1 (refer to numeral 5).

Subsequently, a fine program operation may be performed on the first page PG1 (refer to numeral 6). Thereafter, a foggy program operation may be performed on the sixth page PG6 included in the second physical word line WL2 (refer to numeral 7), and a fine program operation may be performed on the second page PG2 included in the first physical word line WL1 (refer to numeral 8).

That is, according to the program sequence information of FIG. 12, foggy program operations and fine program operations may be alternately performed on pages included in different physical word lines on a page basis, rather than being performed in such a way that, after foggy program operations are performed on all pages included in one physical word line, fine program operations are performed on pages included in a preceding physical word line.

For example, a foggy program operation may be performed on the seventh page PG7 included in the second physical word line WL2 (refer to numeral 9), and then a fine program operation may be performed on the third page PG3 included in the first physical word line WL1 (refer to numeral 10).

FIG. 13 is a diagram describing a power off event which occurs when a program operation is performed according to the program sequence information in accordance with the embodiment of FIG. 12.

Referring to FIGS. 8, and 9 to 13, the first to fourth pages PG1 to PG4 may be in a state in which both the foggy program operation and the fine program operation have been performed on each page (refer to numerals 1, 2, 3, 4, 6, 8, 10, and 12). FIG. 13 illustrates that a power off event occurs while a foggy program operation (refer to numeral 11) is performed on the eighth page PG8 of the second physical word line WL2 after foggy program operations on the fifth pages to seventh pages PG5 to PG7 of the second physical word line WL2 have been completed (refer to numerals 5, 7, and 9).

If the power off event occurs, the program controller 211 of the memory controller 200 may acquire information about a to-be-completed page, which is a page on which the program operation is to be completed. The to-be-completed page may be a page on which a foggy program operation has completed and a fine program operation is not yet performed. Therefore, the fifth to eighth pages PG5 to PG8 of the second physical word line WL2 may be to-be-completed pages.

The program controller 211 may control the memory device 100 to perform fine program operations on the fifth to eighth pages PG5 to PG8 of the second physical word line WL2.

Thereafter, the program controller 211 may control the memory device 100 to perform a dummy program operation of programming dummy data on each of at least one or more boundary pages of a physical word line adjacent to the second physical word line WL2 that is the physical word line on which the program operation is interrupted due to the power off event. Hence, the dummy program operation may be performed on each of the ninth to twelfth pages PG9 to PG12 of the third physical word line WL3. The dummy program operation may be a program operation of storing dummy data. However, here, the program controller 211 may control the memory device 100 to perform only the foggy program operation of the dummy program operation on each of the ninth to twelfth pages PG9 to PG12.

The reason for this is because there is no need to perform the fine program operation of the dummy program operation because the dummy program itself is to prevent boundary pages from being in an erased state and dummy data to be stored by the dummy program operation is meaningless invalid data.

Subsequently, the program controller 211 may store power off information in the power off information storage 230. The power off information may include at least one of information about the page PG8 on which the program operation is interrupted due to the power off event, information about the boundary pages PG9 to PG12 in which the dummy data is stored, and information about the page PG13 on which a subsequent program operation is to be performed. The power off information may be stored in the memory device 100 before the power supply to the storage device is interrupted.

In the embodiment described with reference to FIG. 13, data stored in a program sequence in which, after a foggy program operation is performed on one page included in one physical word line, a fine program operation is performed on one page included in a preceding physical word line. Hence, if a power off event occurs, the number of pages on which program operations must be completed may be reduced compared to that of the embodiment of FIG. 11.

Furthermore, compared to the embodiment of FIG. 11, because only the foggy program operation of the dummy program operation is performed, the time it takes to perform the dummy program operation may be reduced. Consequently, the number of operations required to be performed in response to a power off request may be reduced compared to that of the embodiment of FIG. 11.

FIG. 14 is a flowchart illustrating a method of operating the storage device in accordance with an embodiment of the present disclosure.

Referring to FIG. 14, at step S1401, the storage device 50 may perform a program operation.

At step S1403, the storage device 50 may determine whether a power off event has occurred. If the power off event occurs, the process proceeds to step S1407. If not, the process proceeds to step S1405.

At step S1405, the storage device may determine whether the program operation has been completed. As a result of the determination, if the program operation has been completed, the process is terminated. If not, the process may return to step S1401.

At step S1407, the storage device 50 may complete the program operation by performing fine program operations on pages on which foggy program operations have been performed and the fine program operations have not yet been performed.

At step S1409, the storage device may perform a dummy program operation of storing dummy data on each of at least one or more boundary pages included in a physical word line adjacent to a page on which the program operation is interrupted due to the power off event. In the dummy program operation, only the foggy program operation may be performed, and the fine program operation may be skipped.

Figure 15:
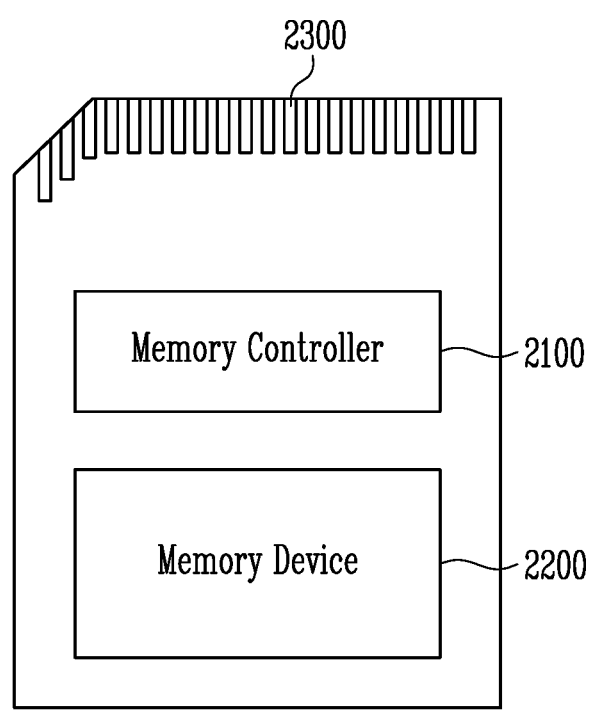
FIG. 15 is a block diagram illustrating a memory card system to which a storage device in accordance with an embodiment of the present disclosure is applied.

FIG. 15 is a block diagram illustrating a memory card system 2000 to which a storage device in accordance with an embodiment of the present disclosure is applied.

Referring FIG. 15, the memory card system 2000 may include a memory controller 2100, a memory device 2200 and a connector 2300.

The memory controller 2100 is coupled to the memory device 2200. The memory controller 2100 may access the memory device 2200. For example, the memory controller 2100 may perform a read operation, a program operation, or an erase operation of the memory device 2200, or control a background operation of the memory device 2200. The memory controller 2100 may provide an interface between the memory device 2200 and the host. The memory controller 2100 may drive firmware for controlling the memory device 2200. The memory controller 2100 may be embodied in the same manner as that of the memory controller 200 described with reference to FIG. 1.

In an embodiment, the memory controller 2100 may include components such as a random access memory (RAM), a processing unit, a host interface, and a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

For example, the memory controller 2100 or the memory device 2200 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline Package (TSOP), System In Package (SIP), Multi Chip Package (MCP), Wafer-level Fabricated Package (WFP), or Wafer-Level Processed Stack Package (WSP), and may be provided as a single semiconductor package. Alternatively, the memory device 2200 may include a plurality of nonvolatile memory chips, and the plurality of nonvolatile memory chips may be packaged based on the above-mentioned package methods and provided as a single semiconductor package.

For example, the memory controller 2100 and the memory device 2200 may be integrated into a single semiconductor device. For example, the memory controller 2100 and the memory device 2200 may be integrated into a single semiconductor device to form a solid state drive (SSD). In an embodiment, the memory controller 2100 and the memory device 2200 may be integrated into a single semiconductor device to form a memory card. For example, the memory controller 2100 and the memory device 2200 may be integrated into a single semiconductor device to form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

For example, the memory device 2200 may be the memory device 100 described with reference to FIG. 1.

Figure 16:
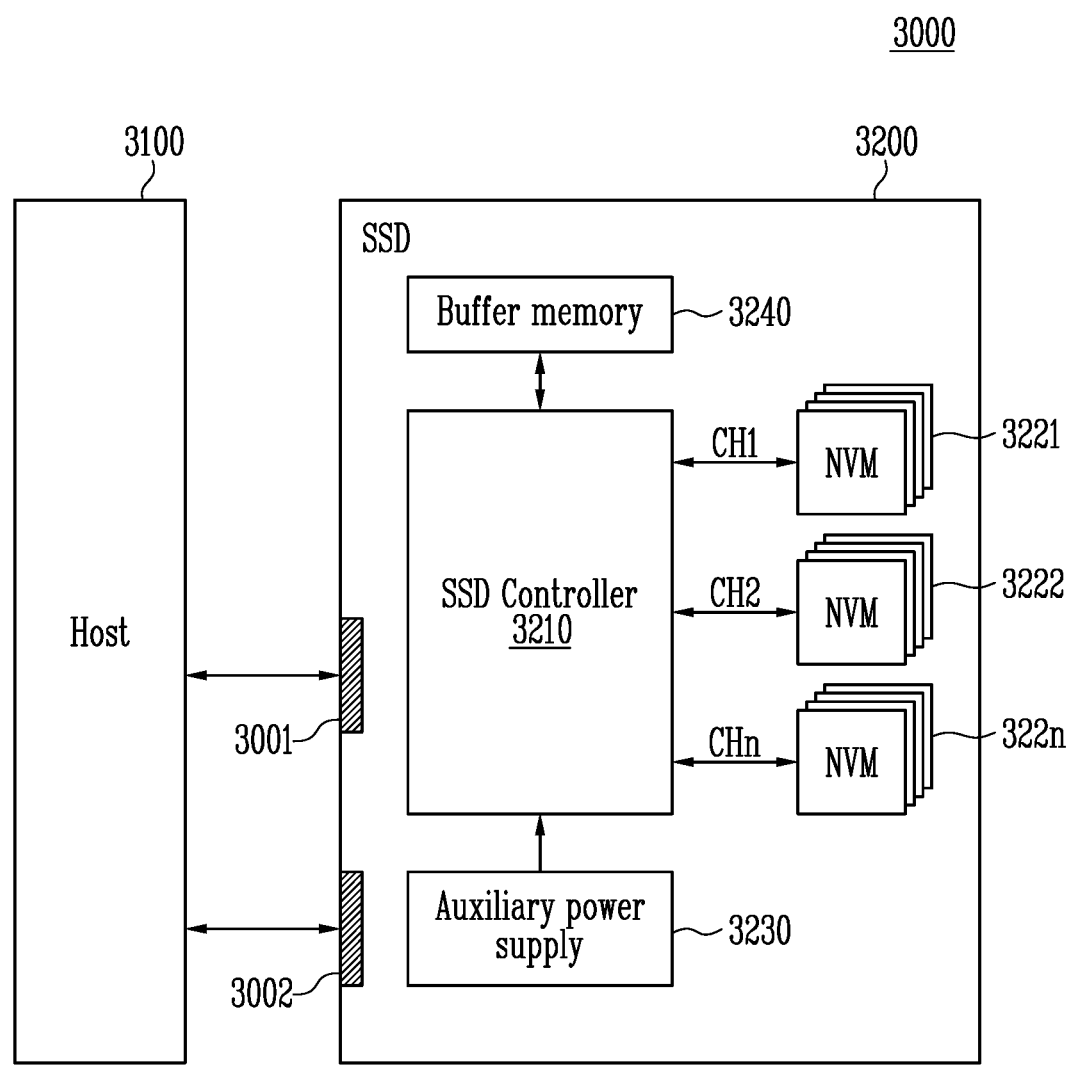
FIG. 16 is a block diagram illustrating a solid state drive (SSD) system to which a storage device in accordance with an embodiment of the present disclosure is applied.

FIG. 16 is a block diagram illustrating a solid state drive (SSD) system 3000 to which a storage device in accordance with an embodiment of the present disclosure is applied.

Referring to FIG. 16, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322$n$, an auxiliary power supply 3230, and a buffer memory 3240.

In an embodiment, the SSD controller 3210 may perform the functions of the memory controller 200, described above with reference to FIG. 1.

The SSD controller 3210 may control the plurality of flash memories 3221 to 322$n$ in response to the signals SIG received from the host 3100. In an embodiment, the signals SIG may be signals based on an interface between the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100, and may be charged by the power PWR. The auxiliary power supply 3230 may supply the power to the SSD 3200 when the power supply from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322$n$ or may temporarily store metadata (e.g., a mapping table) of the flash memories 3221 to 322$n$. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

For example, each of the nonvolatile memory devices 3221 to 322$n$ may be the memory device 100 described with reference to FIG. 1.

Figure 17:
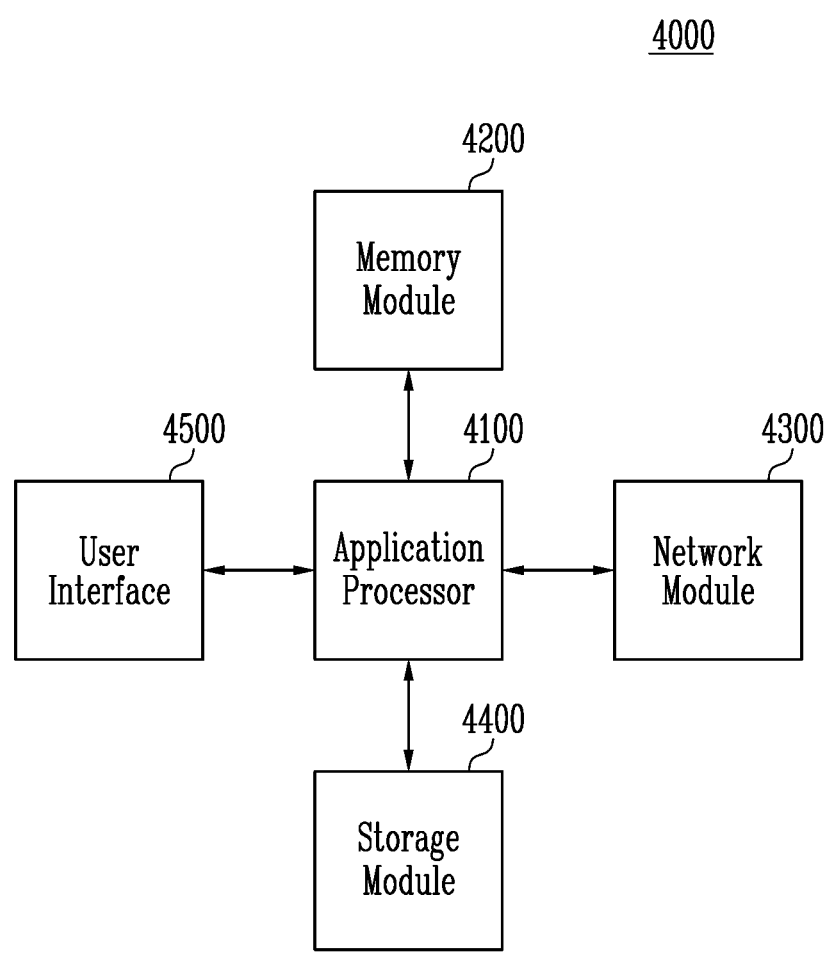
FIG. 17 is a block diagram illustrating a user system to which a storage device in accordance with an embodiment of the present disclosure is applied.

FIG. 17 is a block diagram illustrating a user system 4000 to which a storage device in accordance with an embodiment of the present disclosure is applied.

Referring to FIG. 17, the user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory, or a cache memory of the user system 4000. The memory module 4200 may include a volatile RAM such as a DRAM, an SDRAM, a DDR SDRAM, a DDR2 SDRAM, a DDR3 SDRAM, an LPDDR SDARM, and an LPDDR3 SDRAM, or a nonvolatile RAM such as a PRAM, a ReRAM, an MRAM, and an FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as code division multiple access (CDMA), global system for mobile communication (GSM), wideband CDMA (WCDMA), CDMA-2000, time division multiple access (TDMA), long term evolution (LTE), WiMAX, WLAN, UWB, Bluetooth, or WI-FI communication. In an embodiment, the network module 4300 may be included in the application processor 4100.

The storage module 4400 may store data therein. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, and each of the plurality of nonvolatile memory devices may be the memory device 100 described above with reference to FIG. 1.

The user interface 4500 may include interfaces for inputting data or instructions to the application processor 4100 or outputting data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as an a Liquid Crystal Display (LCD), an Organic Light Emitting Diode (OLED) display device, an Active Matrix OLED (AMOLED) display device, an LED, a speaker, a monitor, and so on.

In a storage device and a method of operating the storage device according to an embodiment of the present disclosure, the time it takes to perform a power off operation may be reduced.

Examples of embodiments have been disclosed herein, and although specific terms are employed, the terms are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory controller configured to control a memory device including a memory block coupled to physical word lines each including a plurality of pages, the memory controller comprising:
   a program sequence information storage configured to store program sequence information of the plurality of pages, which includes information about a sequence of foggy program operations and fine program operations to be performed on the plurality of pages, wherein the foggy program operations and the fine program operations are alternately performed in units of a single page, and pages on which each of the foggy program operations and the fine program operations in a continuous sequence are performed are respectively included in different word lines; and
   a program controller configured to control the memory device, in response to a power off event occurring while a program operation is performed on a selected page among the plurality of pages, based on the program sequence information, alternately to perform the fine program operations on to-be-completed pages and to perform the foggy program operations for a dummy program operation on boundary pages,
   wherein the to-be-completed pages are pages on which the foggy program operations have been completed and on which the fine program operations have not yet been performed, and the boundary pages are pages on which the dummy program operation storing dummy data is to be performed, and
   wherein when the fine program operations on the to-be-completed pages are completed, the dummy program operation is completed while only the foggy programs are performed on the boundary pages and the fine programs are not performed on the boundary pages.

2. The memory controller according to claim 1, wherein the program operation includes:
   a foggy program operation of programming memory cells included in the plurality of pages so that each of the memory cells has a threshold voltage corresponding to any one of intermediate states respectively corresponding to a plurality of states, and
   a fine program operation of programming the memory cells having the threshold voltages corresponding to the intermediate states so that each of the memory cells has a threshold voltage corresponding to any one of the plurality of states.

3. The memory controller according to claim 1, wherein a number of the boundary pages corresponds to a number of the plurality of pages.

4. The memory controller according to claim 1, wherein the program controller is further configured to store power off information after the dummy program operation is completed.

5. The memory controller according to claim 4, further comprising a power off information storage configured to store the power off information.

6. The memory controller according to claim 4, wherein the power off information includes at least one of information about the selected page on which the program operation is interrupted due to the power off event, information about the boundary pages, and information about pages included in a physical word line on which a program operation is to be performed in a sequence subsequent to the physical word line including the selected page.

7. A memory device comprising:
a memory block coupled to physical word lines each including a plurality of pages;
a peripheral circuit configured to perform a program operation of storing data in the plurality of pages;
a control logic configured to control the peripheral circuit, wherein the program operation includes:
   a foggy program operation of programming memory cells included in the plurality of pages so that each of the memory cells has a threshold voltage corresponding to any one of intermediate states respectively corresponding to a plurality of states, and
   a fine program operation of programming the memory cells having the threshold voltages corresponding to the intermediate states so that each of the memory cells has a threshold voltage corresponding to any one of the plurality of states,
wherein the control logic controls the peripheral circuit to perform foggy program operations and fine program operations alternately in units of a single page, and pages on which each of the foggy program operations and the fine program operations in a continuous sequence are performed are respectively included in different word lines,
wherein the control logic controls the peripheral circuit to further alternately perform, in response to a power off event in which power supply to the memory device is interrupted, based on the program sequence information, the fine program operations on each of to-be-completed pages and the foggy program operations for a dummy program operation on boundary pages,
wherein the to-be-completed pages are pages on which the foggy program operations have been completed and on which the fine program operations have not yet been performed, and the boundary pages are pages on which the dummy program operation storing dummy data is to be performed, and
wherein when the fine program operations on the to-be-completed pages are completed, the dummy program operation is completed while only the foggy programs are performed on the boundary pages and the fine programs are not performed on the boundary pages.

8. The memory device according to claim 7,
wherein the foggy program operation and the fine program operation each includes a plurality of program loops,
wherein each of the plurality of program loops includes a program voltage application operation and a verify operation, and
wherein a level of a verify voltage to be used in the verify operation of the foggy program operation is less than a level of a verify voltage to be used in the verify operation of the fine program operation.

9. The memory device according to claim 7, wherein the plurality of pages included in each physical word line is coupled in common to the physical word line.

10. The memory device according to claim 7, wherein each of the physical word lines comprises logical word lines respectively coupled to the plurality of pages.

11. The memory device according to claim 7, wherein the dummy program operation is an operation to store dummy data in the boundary pages.

12. The memory device according to claim 11, wherein a number of the boundary pages corresponds to a number of the plurality of pages.

13. A storage device comprising:
a memory device comprising a memory block coupled to physical word lines each including a plurality of pages; and
a memory controller configured to control the memory device such that, in response to a power off event occurring while a program operation is performed on a selected page among the plurality of pages, based on the program sequence information, fine program operations are performed on to-be-completed pages and foggy program operations for a dummy program operation on boundary pages alternately, wherein the to-be-completed pages are pages on which the foggy program operations have been completed and on which the fine program operations have not yet been performed and the boundary pages are pages on which the dummy program operation storing dummy data is to be performed,
wherein the program operation includes:
a foggy program operation of programming memory cells included in the plurality of pages so that each of the memory cells has a threshold voltage corresponding to any one of intermediate states respectively corresponding to a plurality of states, and
a fine program operation of programming the memory cells having the threshold voltages corresponding to the intermediate states so that each of the memory cells has a threshold voltage corresponding to any one of the plurality of states,
wherein the foggy program operations and the fine program operations are alternately performed in units of a single page, and pages on which each of the foggy program operations and the fine program operations in a continuous sequence are performed are respectively included in different word lines, and
wherein when the fine program operations on the to-be-completed pages are completed, the dummy program operation is completed while only the foggy programs are performed on the boundary pages and the fine programs are not performed on the boundary pages.

14. The storage device according to claim 13, wherein the dummy program operation is an operation to store dummy data in the boundary pages.

* * * * *